United States Patent [19]

Teng et al.

[11] Patent Number: 5,198,383

[45] Date of Patent: Mar. 30, 1993

[54] METHOD OF FABRICATING A COMPOSED PILLAR TRANSISTOR DRAM CELL

[75] Inventors: Clarence W.-H. Teng; Robert R. Doering, both of Plano, Tex.

[73] Assignee: Texas Instruments Incorporated, Dallas, Tex.

[21] Appl. No.: 720,541

[22] Filed: Jun. 25, 1991

[51] Int. Cl.[5] ............... H01L 21/265; H01L 21/70
[52] U.S. Cl. ...................................... 437/47; 437/52; 437/60; 437/203
[58] Field of Search ............ 437/47, 52, 60, 919; 357/23.6; 365/185

[56] References Cited

U.S. PATENT DOCUMENTS

| 4,763,181 | 8/1988 | Tasch, Jr. ................ | 365/185 |
| 4,830,978 | 5/1989 | Teng et al. ................ | 437/52 |
| 4,926,224 | 5/1990 | Redwine ................... | 357/23.6 |
| 5,034,787 | 7/1991 | Dhong et al. ............. | 357/23.66 |

FOREIGN PATENT DOCUMENTS

| 0280851 | 7/1990 | Fed. Rep. of Germany ... 357/23.66 |
| 2-83968 | 3/1990 | Japan ..................................... 437/52 |
| 2-188956 | 7/1990 | Japan ..................................... 437/52 |

OTHER PUBLICATIONS

"A Surrounding Gate Transistor (SGT) Cell for 64/256Mbit DRAMs", by Sunouchi et al., USLI Research Center, Japan, 1989 IEEE, pp. 23-26.

Primary Examiner—Mary Wilczewski
Assistant Examiner—Loc Q. Trinh
Attorney, Agent, or Firm—Peter T. Rutkowski; Richard Donaldson; William E. Hiller

[57] ABSTRACT

A memory cell comprises a semiconductor pillar comprising an inversion layer formed on a side wall of the pillar. A conductive capacitor of the memory cell comprises a first electrode formed by the inversion layer. A transistor of the memory cell is formed in the pillar and comprises a first source/drain region, a gate, and a second source/drain region comprising the inversion layer. The gate is coupled to a control line partially overlying a top end of the pillar.

20 Claims, 10 Drawing Sheets

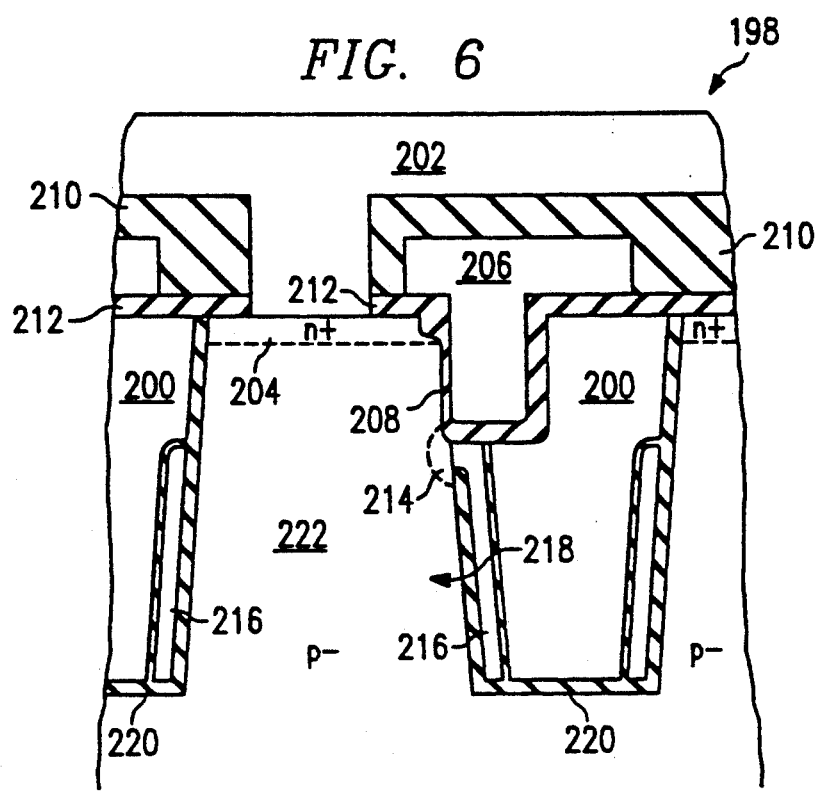
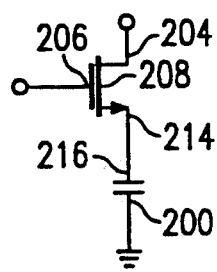
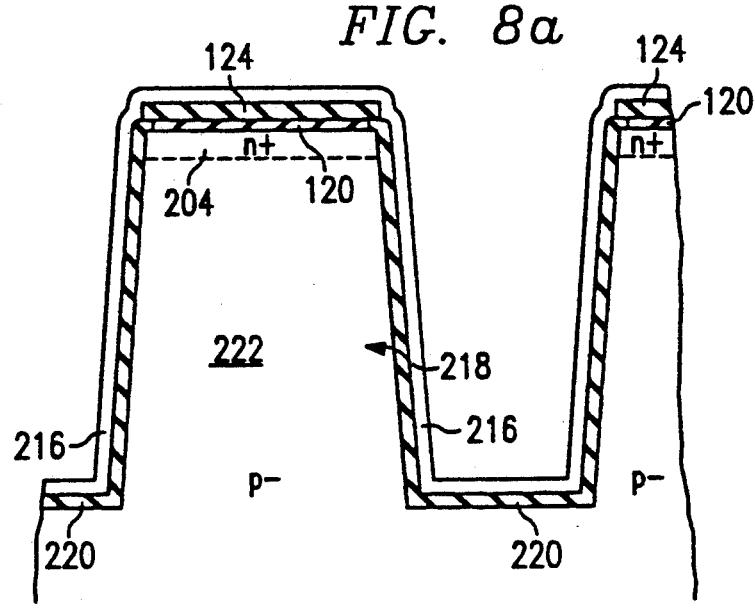

METHOD OF FABRICATING A COMPOSED PILLAR TRANSISTOR DRAM CELL

RELATED APPLICATIONS

This application is related to U.S. Pat. No. 5,156,992, by Teng et al., entitled "Poly-Sheet Pillar Transistor DRAM Cell", filed concurrently herewith. This application is also related to U.S. Pat. No. 5,103,276, by Shen et al., filed Jun. 1, 1988, entitled "A High Performance Composed Pillar DRAM Cell"; U.S. patent application Ser. No. 07/700,726, by Shen et al., filed May 15, 1991, entitled "High Performance Composed Pillar Dram Cell"; and U.S. Pat. No. 5,106,776, by Shen et al., filed May 15, 1991, entitled "High Performance Composed Pillar Dram Cell".

TECHNICAL FIELD OF THE INVENTION

This invention relates in general to integrated circuits, and more particularly to the field of dynamic random access memories.

BACKGROUND OF THE INVENTION

The quest for smaller memory cells to allow increased capacity in integrated circuit memories is a well-known goal. The search for methods of fabricating higher density memories has lead to an entire memory cell, including transistor and storage capacitor, being placed in a single deep cavity (trench) formed in the surface of integrated circuit substrate. See, for example, U.S. Pat. No. 4,830,978, by Teng et al., issued May 16, 1989, which is assigned to the Assignee of the present application and is hereby incorporated by reference.

The inclusion of both the transistor and the capacitor in a single trench has resulted in parasitic capacitance problems. Specifically, the bit line and word line capacitive coupling to the memory cell disrupts the data stored in the memory cell. Moreover, the transistor structure in the trench occupies additional area which creates leakage problems from both the bit line and the storage node, thereby requiring an undesirably large space between memory cells.

A need therefore exists for a dynamic random access memory (DRAM) cell that reduces parasitic capacitance, leakage, and spacing requirements between memory cells.

SUMMARY OF THE INVENTION

In one aspect of the invention, a memory cell comprises a semiconductor pillar comprising an inversion layer formed on a side wall of the pillar. A conductive capacitor of the memory cell comprises a first electrode formed by the inversion layer. A transistor of the memory cell is formed in the pillar and comprises a first source/drain region, a gate, and a second source/drain region comprising the inversion layer. The gate is coupled to a control line partially overlying a top end of the pillar.

A technical advantage of the present invention is the reduction of spacing requirements between memory cells. A further advantage of the present invention is that a memory cell has a large cell capacitance and a small bit line resistance. Another advantage of the present invention is that a memory cell does not require epitaxial material, thereby diminishing the cost of wafer substrate.

Yet another technical advantage of the present invention is that a memory cell does not require buried lateral contacts.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates a side view diagram of a polysheet pillar transistor (PSP) memory cell in accordance with a second embodiment in the detailed description;

FIG. 7 illustrates an electrical schematic diagram indicating the electrical function of the PSP memory cell; and FIGS 8a–g illustrate processing steps to fabricate the PSP memory cell.

DETAILED DESCRIPTION OF THE INVENTION

The preferred embodiment of the present invention and its advantages are best understood by referring to FIGS. 1–8 of the drawings, like numerals being used for like and corresponding parts of the various drawings.

Two embodiments of a pillar transistor dynamic random access memory (DRAM) cell are described in this detailed description. Each of the embodiments provides an array of one transistor/one capacitor memory cells.

Figure 1:
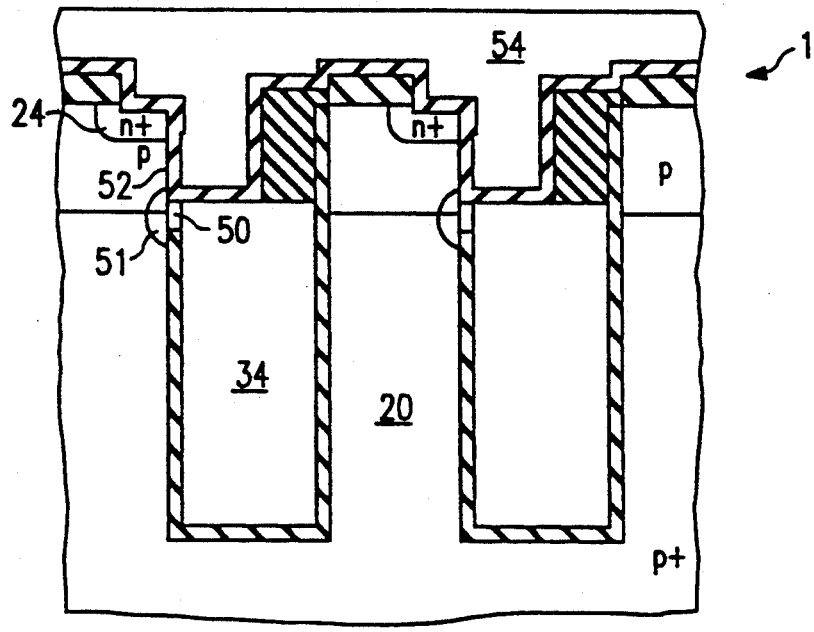
FIG. 1 illustrates a side view of a composed trench transistor (CTT) memory cell.
Figure 2:
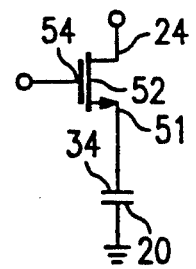
FIG. 2 illustrates an electrical schematic diagram indicating the electric function of the CTT memory cell.

FIG. 1 is a side view of a composed trench transistor (CTT) memory cell 1 described in U.S. Pat. No. 4,830,978, which is hereby incorporated by reference. FIG. 2 is an electrical schematic diagram indicating how the various components of memory cell 1 of FIG. 1 behave electrically.

With reference to FIG. 1, polycrystalline silicon layer 54 extends into a trench to serve as a transistor gate controlling channel current in channel 52. N+ region 24 serves as a drain, and N region 51 serves as a source for the pass transistor of memory cell 1. Source 51 is connected to polycrystalline silicon capacitor plate 34 via buried lateral contact 50. Buried lateral contact 50 is a polycrystalline silicon region. The other plate of the memory cell capacitor is provided by substrate 20. Substrate 20 is a heavily doped P+ region which is connected to ground as shown in FIG. 2.

Since substrate 20 serving as one plate of the memory cell capacitor is connected to ground, the charge distribution on the substrate side of the capacitor is partially dispersed away from the dielectric further into substrate 20 toward the ground node. This diminished concentration of charge away from the dielectric results in an increased effective thickness of capacitor dielectric, thereby reducing cell capacitance and hence requiring a larger memory cell area. The larger memory cell area results in a lower density integrated circuit memory.

Figure 3:
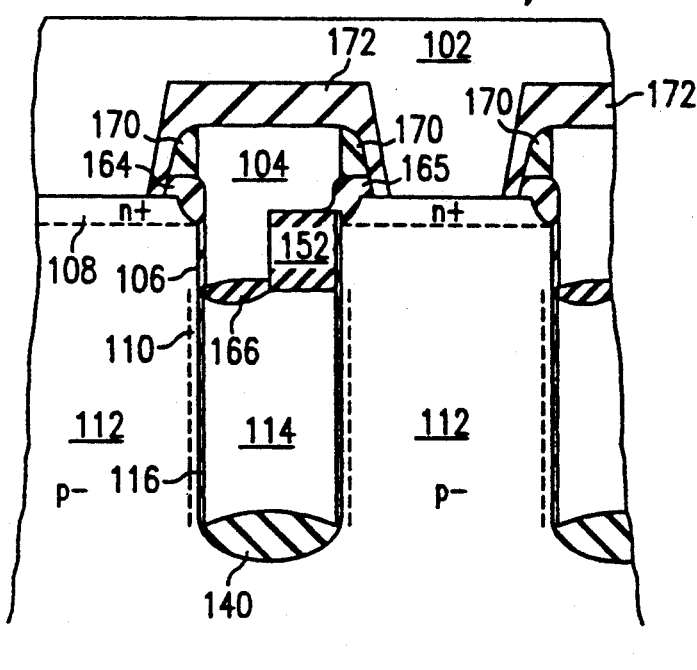
FIG. 3 illustrates a side view diagram of a composed pillar transistor (CPT) memory cell in accordance with a first embodiment described in the detailed description.

FIG. 3 is a side view diagram of a composed pillar transistor (CPT) memory cell 100 in accordance with one embodiment described in this detailed description. Memory cell 100 of FIG. 3 includes a metal layer 102 running parallel to the plane of the page which serves as a bit line in the memory array. Polycrystalline silicon ("polysilicon") layer 104 running into the plane of the page serves as a word line controlling channel current in channel 106. Pillars 112 comprise P— substrate material and are generally shaped in the form of trapezoidal prisms. N+ region 108 serves as a source, and N+ inversion layer 110 formed around the entire lower perimeter surface of pillar 112 serves as a drain for the pass transistor of memory cell 100. Inversion layer 110 is formed around the entire lower perimeter surface of pillar 112 as a result of polycrystalline silicon N+conductor 114 being biased to $V_{DD}$ relative to pillar 112.

The memory cell capacitor is formed by inversion layer 110 of pillar 112 and by polysilicon region 114. Storage gate oxide 116 serves as the dielectric insulator for the memory cell capacitor and is present around the entire lower perimeter surface of pillar 112.

To operate the memory cell, region 114 is held at a positive voltage $V_{DD}$ in order to maintain inversion charge layer 110 in pillar 112.

Figure 4:
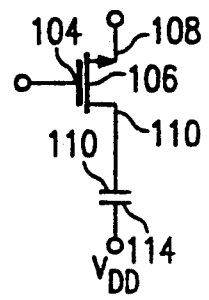
FIG. 4 illustrates an electrical schematic diagram indicating the electric function of CPT memory cell.

FIG. 4 is an electrical schematic diagram indicating the electrical function of the CPT memory cell, in which a substrate providing one plate of the memory cell capacitor is connected to $V_{DD}$ rather than to ground. By connecting the substrate to $V_{DD}$, charge distribution on the substrate side of the capacitor is concentrated near the dielectric, thereby diminishing the effective thickness of capacitor dielectric and hence increasing cell capacitance. By increasing cell capacitance, a smaller memory cell and a higher density integrated circuit memory are possible.

Figure 5A:
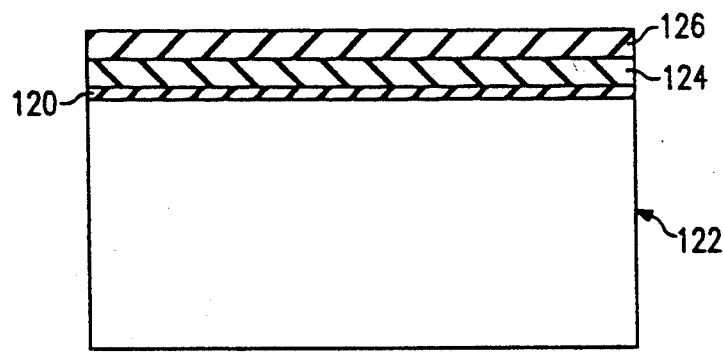
FIGS. 5a–p illustrate processing steps to fabricate the CPT memory cell.
Figure 5B:
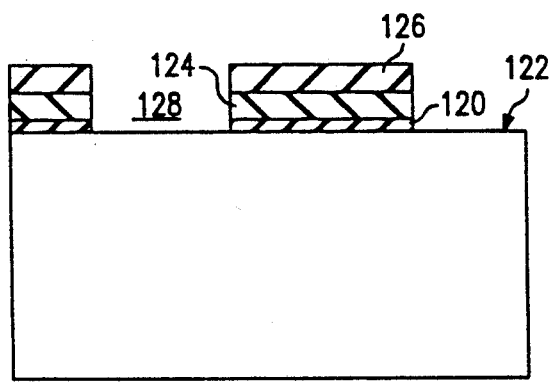
Figure 5C:
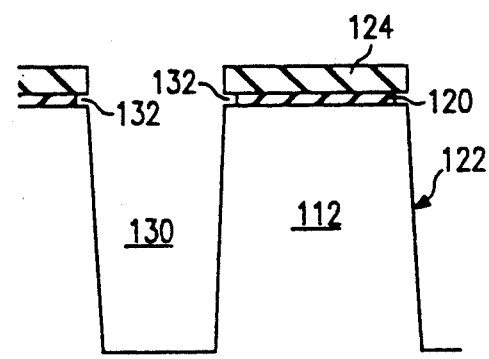
Figure 5D:
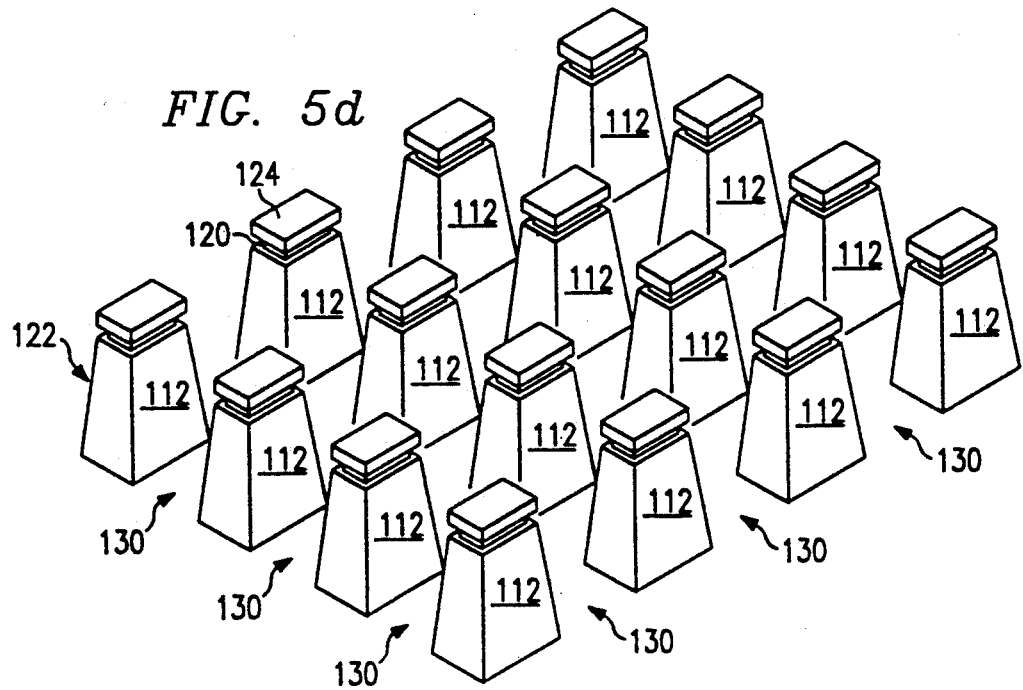
Figure 5E:
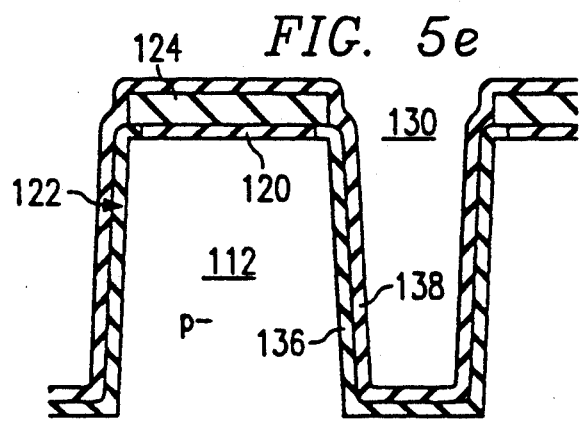
Figure 5F:
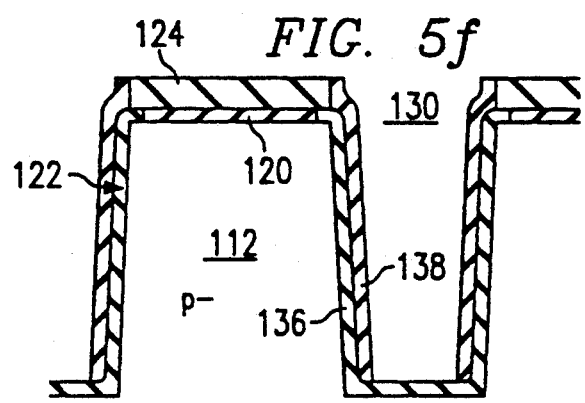
Figure 5G:
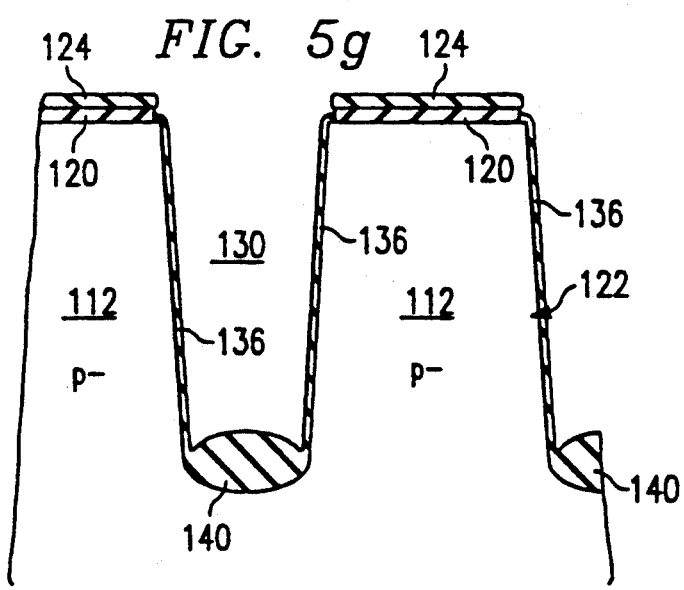
Figure 5H:
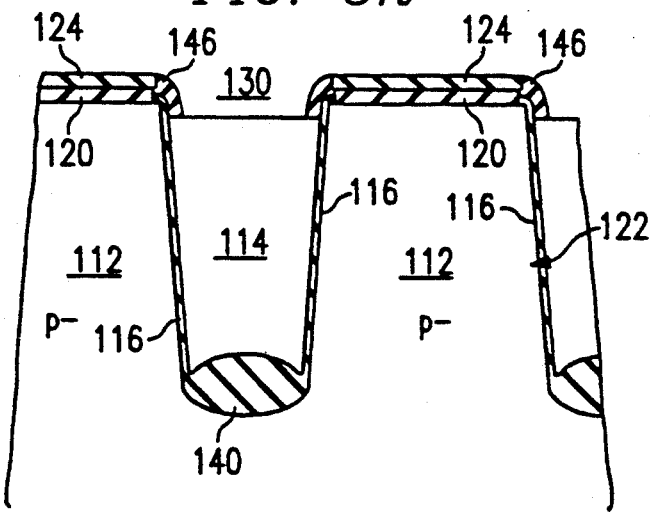
Figure 5I:
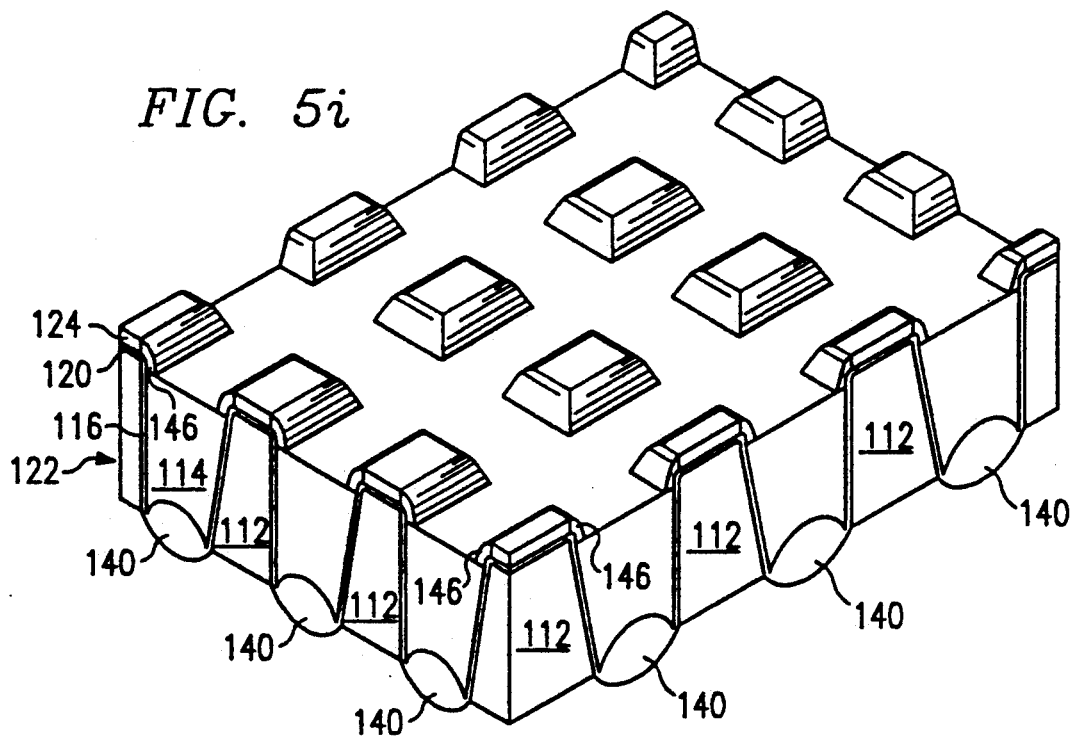
Figure 5J:
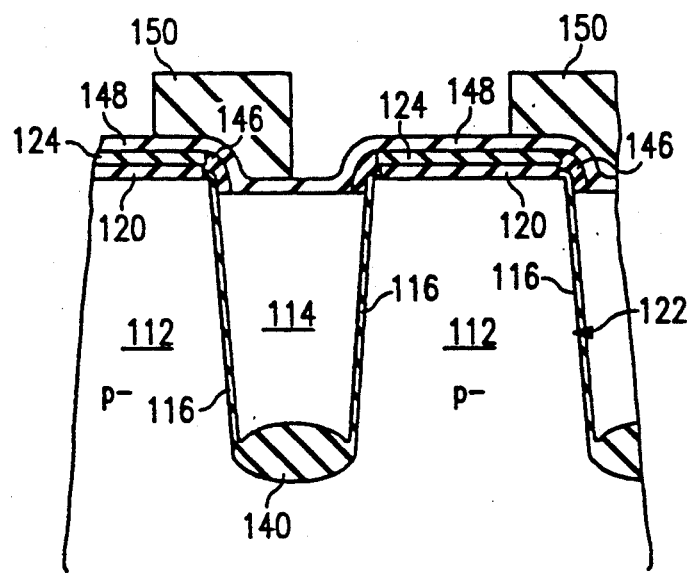
Figure 5K:
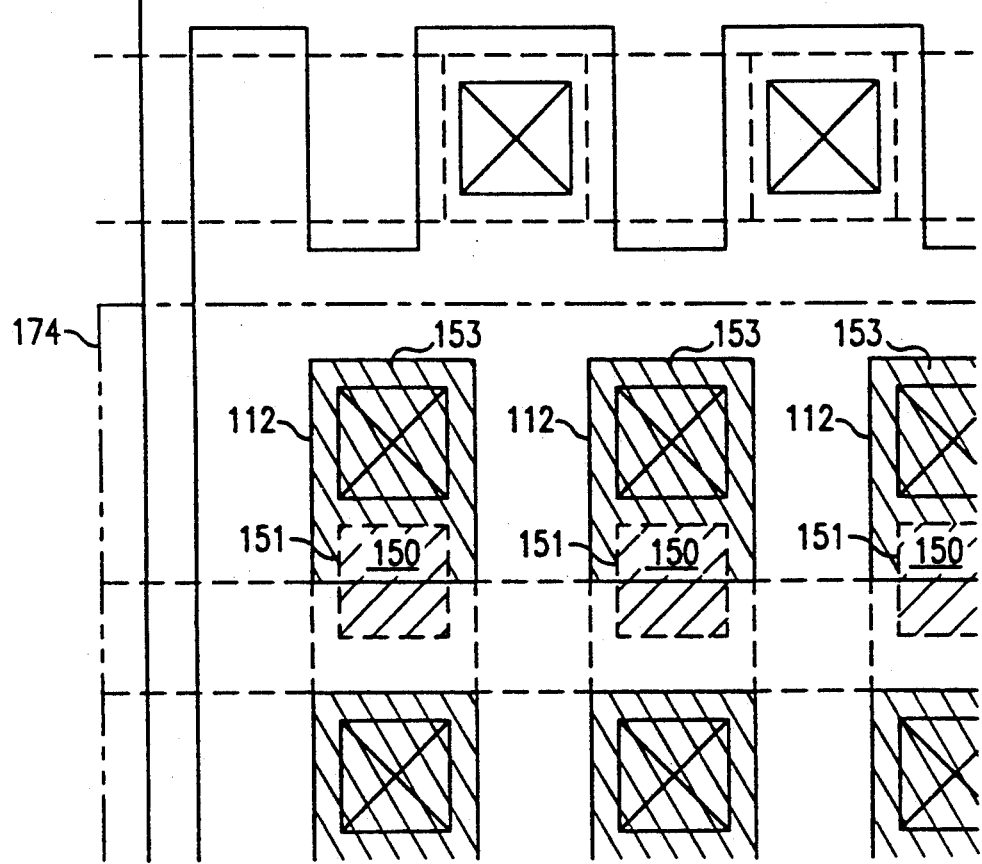
Figure 5L:
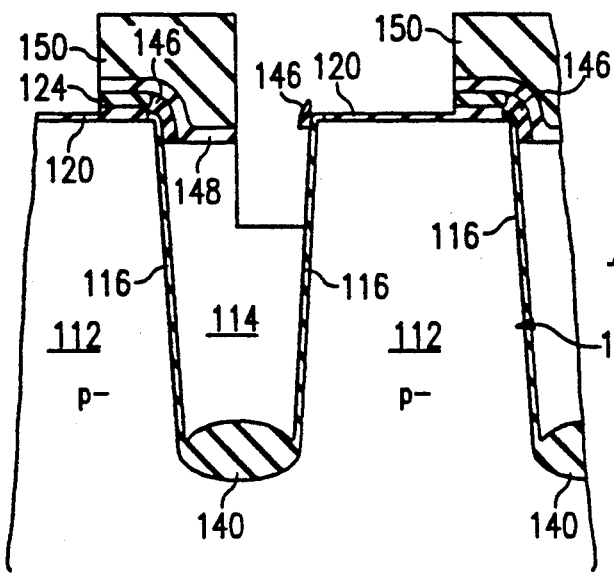
Figure 5M:
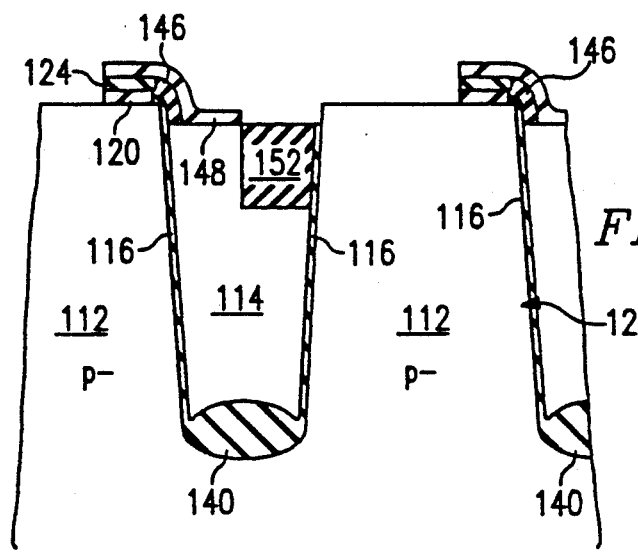
Figure 5N:
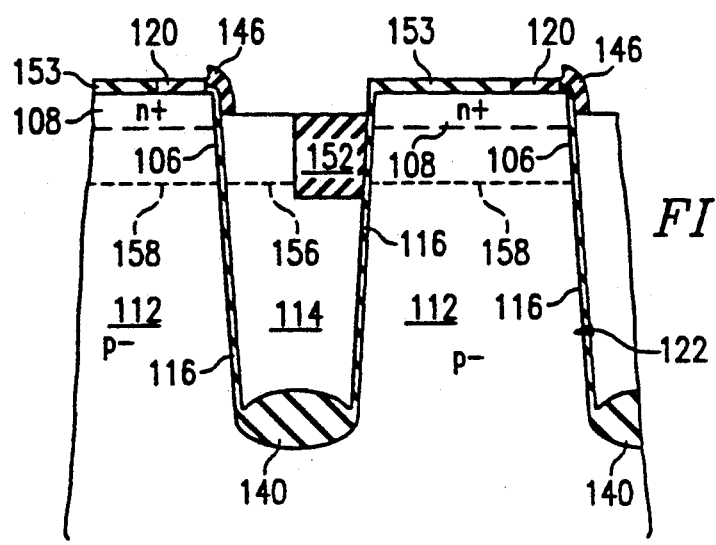
Figure 5O:
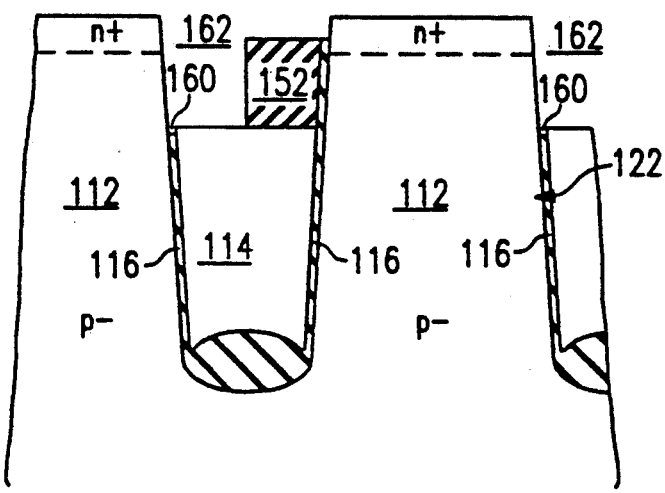
Figure 5P:
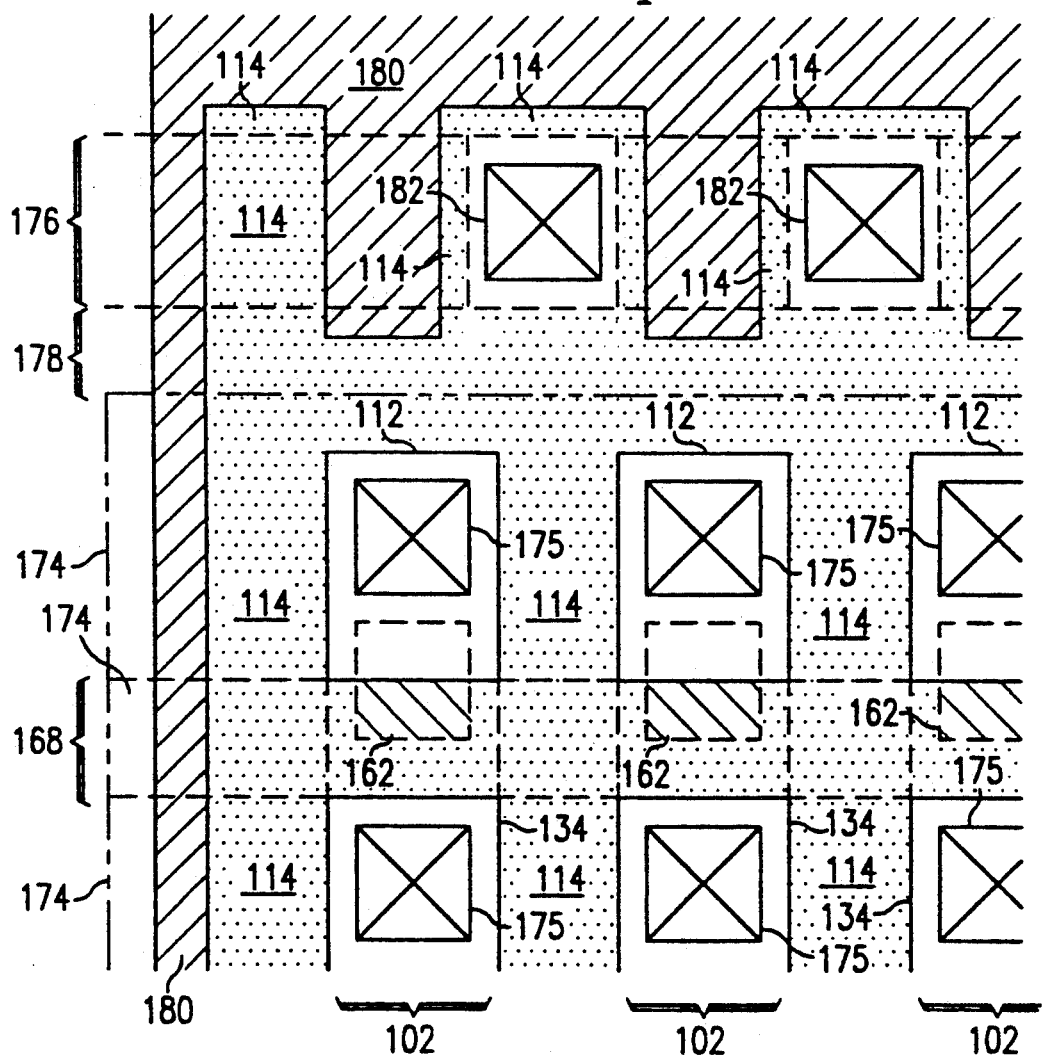

FIGS. 5a-p illustrate processing steps to fabricate memory cell 100 of FIG. 3. With reference to FIG. 5a, the initial stages of the fabrication process comprise growing pad oxide layer 120 having a thickness of approximately 600 angstroms at a temperature of approximately 900° C. over the surface of P— type substrate 122, depositing silicon nitride ("nitride") LPCVD layer 124 having a thickness of approximately 1400 angstroms over pad oxide layer 120, and depositing optional hard-mask oxide layer 126 having a thickness of approximately 11,000 angstroms over silicon nitride layer 124.

Hard-mask oxide layer 126 is patterned to provide a mask over areas defining pillars 112 (shown in FIGS. 5c and 5d. Layers 120, 124 and 126 are etched as shown in FIG. 5b. After etching layers 120, 124 and 126, trench 130 is etched to a depth of 8 micrometers in substrate 122 as shown in FIG. 5c, and hard-mask oxide layer 126 is stripped. When hard-mask oxide layer 126 is stripped, notched areas 132 are formed beneath nitride layer 124, because nitride layer 124 does not protect the outside edges of oxide layer 120.

FIG. 5d illustrates a three-dimensional perspective view corresponding to FIG. 5c. As shown in FIG. 5d, pillars 112 are formed by the etching process. The sloped sides of pillars 112 result in increased surface area on each pillar 112, such that surface area of the capacitor plate formed by inversion layer 110 on each pillar 112 is increased, thereby increasing memory cell capacitance.

In FIG. 5e, sidewall oxide layer 136 is grown on the sidewalls of pillar 112 at a thickness of approximately 350 angstroms at a temperature of approximately 900° C. to completely surround the entire perimeter of each pillar 112 and between neighboring pillars throughout the memory cell array. Sidewall oxide layer 136 isolates substrate 122 from silicon nitride LPCVD layer 138, which is deposited over sidewall oxide layer 136 and over nitride layer 124 at a thickness of approximately 400 angstroms. Nitride layer 138 is then etched anisotropically as shown in FIG. 5f, exposing oxide layer 136 on the bottom of trench 130.

With reference to FIG. 5g, field oxide regions 140 are grown to a thickness of approximately 3000 angstroms at a temperature of approximately 900° C. at 10 atmospheres pressure to completely surround the entire base perimeter of each pillar 112. After field oxide region 140 is formed, nitride layer 138 is stripped.

In FIG. 5h, oxide layer 136 is stripped and is replaced by a storage gate oxide layer grown to a thickness of approximately 70 angstroms at a temperature of approximately 900° C. The storage gate oxide layer is overlaid by a storage nitride LPCVD layer deposited at a thickness of approximately 120 angstroms, which is then oxidized. The storage gate oxide and oxidized nitride layers are collectively shown as dielectric layer 116 in FIG. 5h.

In FIG. 5h, insitu-doped LPCVD polysilicon layer 114 having a thickness of approximately 8000 angstroms is deposited to fill trench 130. Polysilicon layer 114 is then annealed (optional) and etched to a thickness of approximately 11,000 angstroms.

With further reference to FIG. 5h, a TEOS oxide layer is deposited and then anisotropically etched to a thickness of approximately 400 angstroms to form sidewall oxide layers 146 which completely surround the entire top perimeter of each pillar 112.

FIG. 5i is a three-dimensional perspective view corresponding to FIG. 5h. As FIG. 5i illustrates, polysilicon layer 114 completely surrounds the entire perimeter of each pillar 112, and P type material 122 is insulated from polysilicon layer 144 by nitride/oxide layer 116 which also completely surrounds the entire perimeter of each pillar 112.

As shown in FIG. 5j, LPCVD silicon nitride layer 148 is deposited at a thickness of approximately 800 angstroms. Photoresist layer 150 is then deposited and patterned to define the pass gate of each memory cell of the array. FIG. 5k illustrates a perspective view of the top of the memory cell array 174. Photoresist layer 150 overlays pass gate 151 of each pillar 112 of array 174.

In FIG. 5l, the uncovered portions of silicon nitride layers 148 and 124 are removed, and uncovered portions of polysilicon layer 114 are etched to a depth of approximately 15,000 angstroms.

In FIG. 5m, photoresist layer 150 is removed, and LPCVD oxide layer 152 is deposited at a thickness of approximately 11,000 angstroms to refill the space created when polysilicon 114 is etched. Oxide layer 152 is etched as shown in FIG. 5m, resulting in portions of oxide layers 120, 146 and 116 also being removed.

In FIG. 5n, array field oxide 153 is grown to a thickness of approximately 800 angstroms at a temperature of approximately 900° C. over each pillar 112 to cover the area on top of each pillar 112 that is uncovered when oxide layer 152 is etched in FIG. 5m. FIG. 5k illustrates the area on top of each pillar 112 that is covered by array field oxide 153.

In FIG. 5n, after array field oxide 153 is grown, nitride layers 124 and 148 are removed, and N+ regions 108 are patterned and implanted on top of each pillar 112 at 3.5e15/cm² As using 180 KeV. A boron implant 156 is placed in polysilicon 114 at 2.0e12/cm² B++ using 140 KeV, thereby permeating the entire memory cell array 174 (shown in FIG. 5k). Portions 158 of boron implant 156 also enter into region 122 of each pillar 112. Boron implant 156 and portions 158 raise the threshold voltage of channel area 106 for each memory cell.

Polysilicon 114 is then etched to a depth of approximately 1.5 micrometers as shown in FIG. 5o, and the exposed portion of nitride/oxide layer 116 is removed along with oxide layers 153, 120, and 146. FIG. 5p is a perspective of the view of memory cell array 174 illustrating a top view of channels 162.

With reference to FIG. 3, gate oxide 164 is grown at a temperature of approximately 900° C. on the side of each pillar 112 in space 162 (shown in FIGS. 5o and 5p) using a differential oxidation technique. Gate oxide 164 partially overlies the top of N+ region 108, thereby allowing word line 104 to also partially overlie N+ region 108 and therefore reducing space between neighboring memory cells and also reducing parasitic capacitance. Under the differential oxidation technique used to grow gate oxide 164, the portion of gate oxide 164 overlying N+ region 108 is approximately ten times thicker (1500 angstroms) than the portion of gate oxide 164 laterally adjacent channel region 106 (150 angstroms). In the differential oxidation process of forming channel oxide 164, oxide regions 165 and 166 are also formed, and notched areas 160 (shown in FIG. 5o) are filled in. Oxide regions 165 and 166 have a thickness of approximately 1500 angstroms.

In FIG. 3, after oxide regions 164, 165 and 166 are grown, insitu-doped LPCVD gate polysilicon 104 is deposited and etched to a thickness of approximately 4500 angstroms. The lower portion of polysilicon 104, which is laterally adjacent oxide 152, resides in space 162 (shown in FIG. 5p). The upper portion of polysilicon 104, which is higher than oxide 152, extends across the memory cell array Word line region 168 (shown in FIG. 5p).

In FIG. 3, after polysilicon 104 is deposited and etched, optional sidewall oxides 170 are formed along the entire length of word line 168 (shown in FIG. 5p). Interlevel oxides 172 are then formed to isolate polysilicon 104 from metal bit line 102. Metal bit line region 102 is connected to N+ regions 108 on top of pillars 112 at metal contact points 175 shown in FIG. 5p.

With further reference to FIG. 5p, in areas 178 and 174, polysilicon 114 is covered by oxide layer 152 (not shown in FIG. 5p) shown in FIG. 5o. Oxide layer 152 does not extend over polysilicon 114 in field plate contact region 176. Moreover, polysilicon 114 is thicker in field plate contact region 176 than in areas 178 and 174, because polysilicon 114 in region 176 is protected during the polysilicon etchings described further hereinabove in connection with FIGS. 5l and 5o. Silicon 180 indicates the edge of the fabrication area. In FIG. 5p, polysilicon regions 114 in areas 176, 178 and 174 are continuously connected beneath spaces 162 and beneath oxide layer 152 (shown in FIG. 5o). Hence, polysilicon 114 may be biased to $V_{DD}$ throughout the entire memory cell array 174 by forming a metal layer across field plate contact region 176 to contact metal field plate contact points 182.

Another embodiment of the pillar memory cell is shown in the poly-sheet pillar transistor (PSP) cell of FIG. 6. Similar to the CPT memory cell shown in FIG. 3, polysilicon layer 200 of the PSP memory cell extends throughout the entire memory cell array, metal bit line layer 202 contacts the N+ region 204 of each pillar, and polysilicon layer 206 provides word line control of channel 208. Interlevel oxide 210 isolates bit line 202 from word line 206. Gate oxide 212 partially overlies N+ region 204 of each pillar, thereby allowing word line 206 to also partially overlie N+ region 204 and therefore reducing space between neighboring memory cells and also reducing parasitic capacitance.

A primary difference between the CPT and PSP memory cells is the presence of diffused N+ region 214 which laterally contacts polysilicon 216. Polysilicon 216 is formed around the entire lower perimeter of P− region 218 of each pillar 222 and forms one plate of the memory cell capacitor. The other plate of the memory cell capacitor is provided by polysilicon 200 and is shared by each memory cell of the array. Hence, unlike the CPT memory cell, an N+ inversion layer is not required on the perimeter surface of the PSP memory cell pillar region 218. This diminishes the chance that the lower portion of region 218 might become a depletion region without sufficient conduction holes to support a mobile flow of electrons, which would create a floating substrate condition.

In another distinction from the memory cell of FIG. 3, the memory cell of FIG. 6 does not contain field oxide regions 140. This fact, when combined with the absence of an N+ inversion layer, eliminates the chance that the inversion layer of one pillar might leak under the field oxide region into the inversion layer of a neighboring pillar.

By eliminating inversion layer 110 of the CPT memory cell of FIG. 3, the PSP memory cell of FIG. 6 achieves a higher cell capacitance, resulting from capacitor plates 200 and 216 both comprising more heavily doped polysilicon. Polysilicon 200 of the PSP memory cell is connected to ground, and the PSP memory cell capacitor consequently does not operate in an inversion mode, unlike the CPT memory cell capacitor of FIG. 3.

FIG. 7 is an electrical schematic diagram indicating how the various components of memory cell 198 of FIG. 6 behave electrically.

The processing steps described hereinabove in connection with the CPT memory cell of FIGS. 5a–d are similarly applicable to fabrication of the PSP memory cell of FIG. 6, with the following exceptions:

(1) Buried N+ region 204 (shown in FIG. 6) is patterned and implanted prior to the growing of pad oxide 120.

(2) Pad oxide 120 is grown to a thickness of 350 angstroms; and (3) LPCVD nitride 124 is deposited at a thickness of 2400 angstroms.

In FIG. 8a, sidewall oxide layer 220 is grown on the sidewalls of pillar 222 at a thickness of approximately 1000 angstroms to completely surround the entire perimeter of each pillar 222 and between neighboring pillars throughout the memory cell array. Doped LPCVD polysilicon layer 216 is deposited over sidewall oxide layer 220 and over nitride layer 124 at a thickness of approximately 1000 angstroms.

Figure 8B:
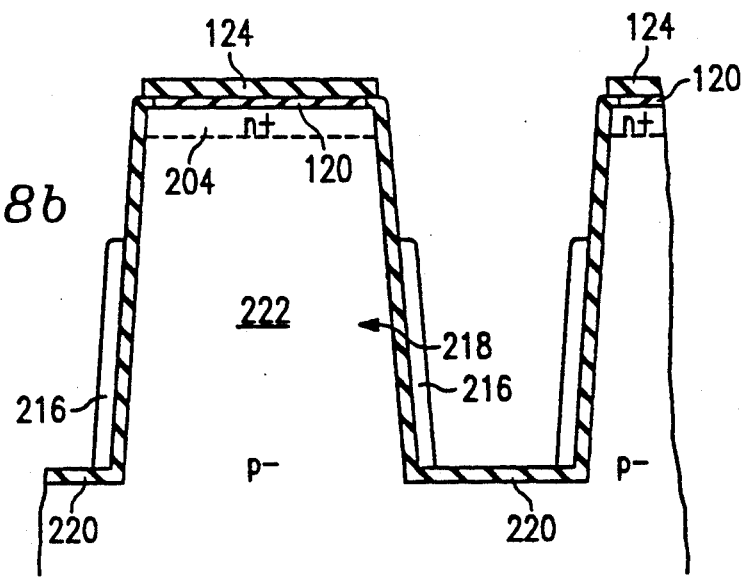

In FIG. 8b, polysilicon layer 216 is anisotropically etched to a depth of approximately 1.5 micrometers. In an alternative embodiment, polysilicon layer 216 is anisotropically etched to a depth of approximately 1000 angstroms, photoresist or polyimide is deposited and etched to a depth of approximately 1.4 micrometers below the upper surface of substrate 218, and polysilicon layer 216 is then isotopically etched to remove the sidewall portion of polysilicon 216 that extends above the photoresist or polyimide layer. In either of these two fabrication embodiments of FIG. 8b, portions of polysilicon 216 remaining adjacent the same pillar 222 are connected, because polysilicon layer 216 extends around the entire perimeter of each pillar 222.

Figure 8C:
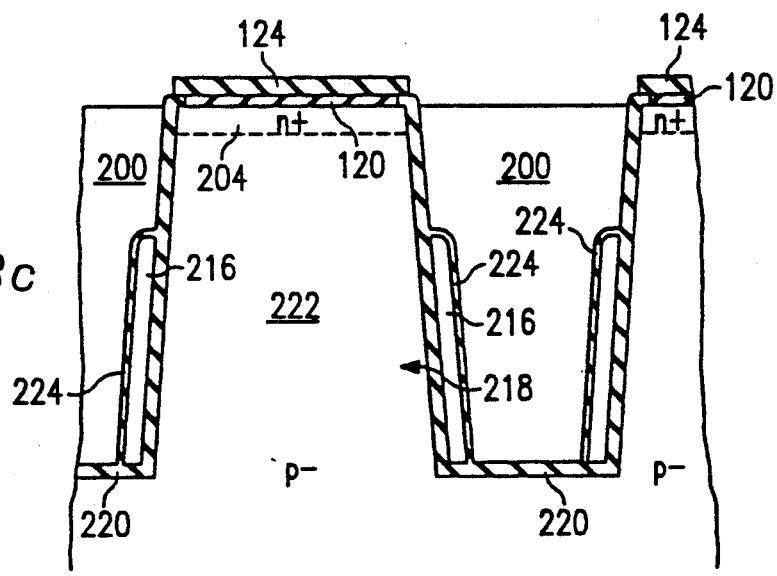

In FIG. 8c, storage oxide layer 224 is formed over polysilicon layer 216 at a thickness of approximately 150 angstroms. Approximately 8000 angstroms of doped LPCVD polysilicon 200 is then deposited and etched to a depth of approximately 9000 angstroms. As in the CPT memory cell array of FIG. 5i, polysilicon 200 extends throughout the entire memory cell array and is common to each pillar 222.

Figure 8D:
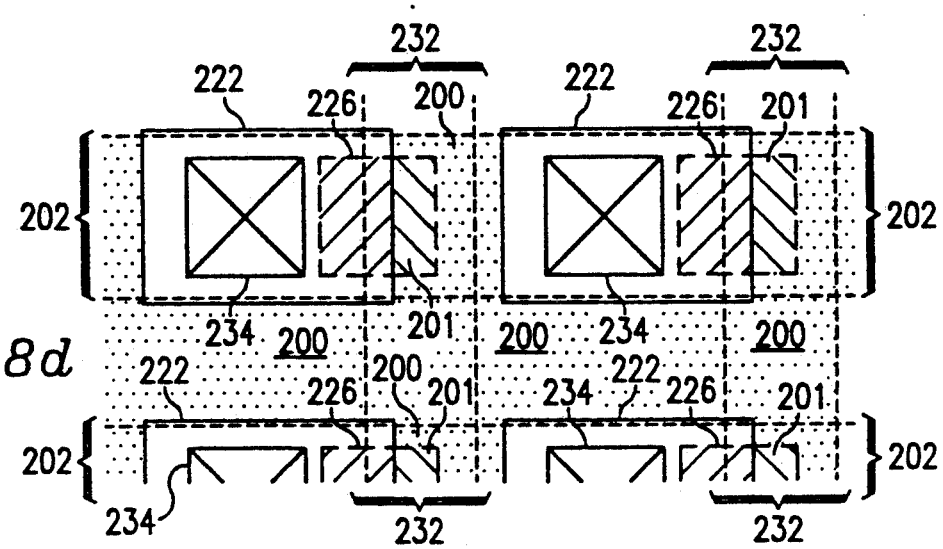
Figure 8E:
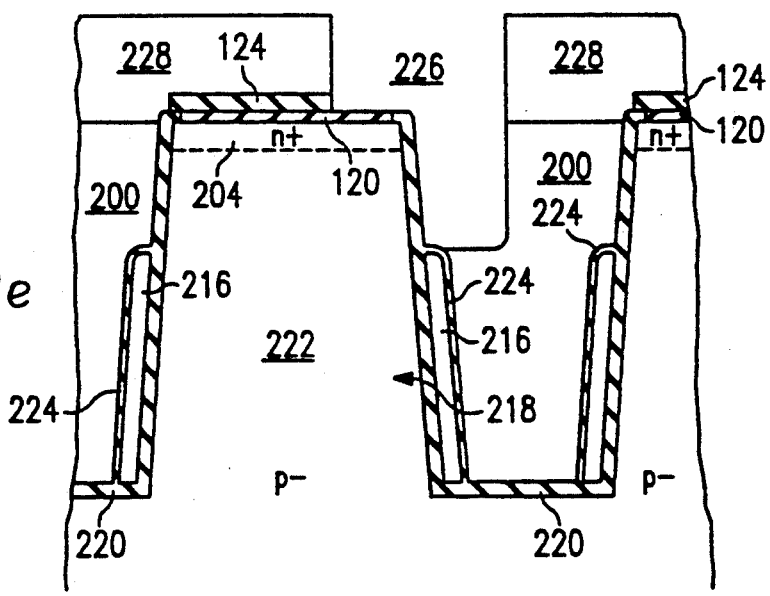

In FIGS. 8d and 8e, pass gate areas 226 are patterned by photoresist layer 228, and exposed polysilicon 201 (FIG. 8d) beneath each pass gate area 226 is etched to a depth of approximately 1.5 micrometers.

Figure 8F:
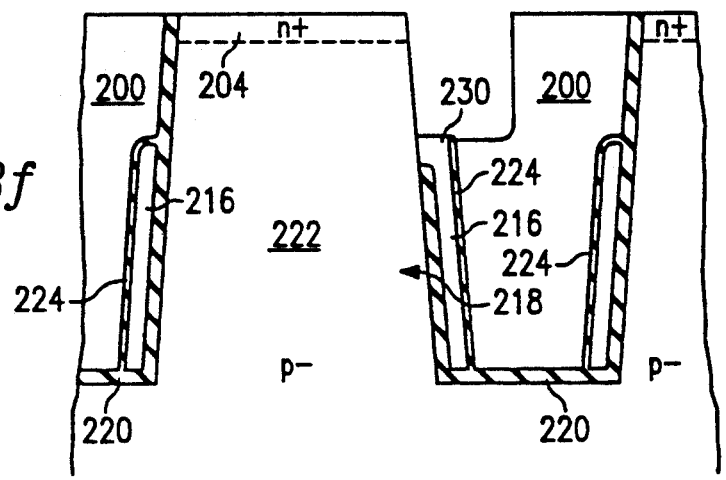

In FIG. 8f, exposed portions of oxide layers 120, 220 and 224 in pass gate area 226 are wet-etched to a depth of approximately 2000 angstroms. Photoresist layer 228 is then stripped. An LPCVD oxide, having a thickness of approximately 150 angstroms, is deposited and then wet-etched to a depth of approximately 150 angstroms, in order to fill any gap in oxide layer 224 between polysilicon layers 216 and 200. A doped LPCVD polysilicon layer, having a thickness of approximately 750 angstroms, is deposited in pass gate area 226 and then is isotopically etched to a depth of approximately 750 angstroms, in order to create lateral contact 230 attached to polysilicon layer 216. Nitride layer 124 is stripped, and oxide layers 120 and 220 are wet-etched, resulting in the formation shown in FIG. 8f.

Figure 8G:
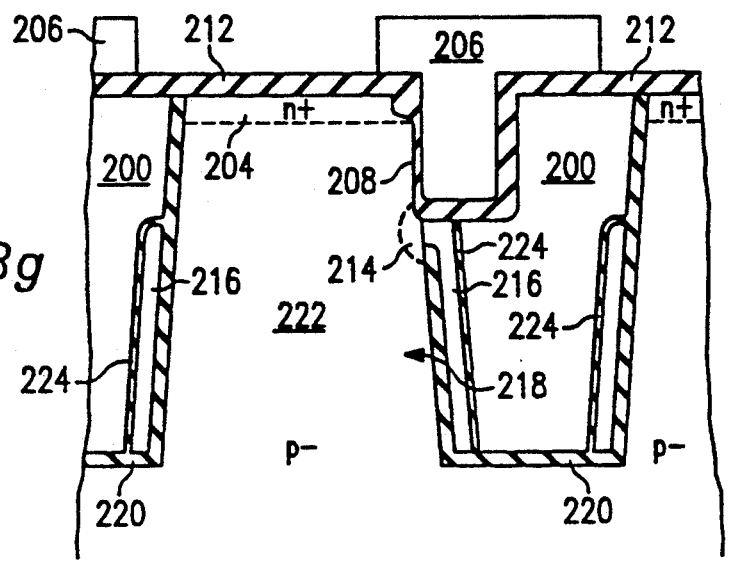

In FIG. 8g, gate oxide 212 is grown using a differential oxidation technique, such that the portion of gate oxide 212 laterally adjacent channel region 208 has a thickness of approximately 150 angstroms, and such that the remaining portions of gate oxide 212 have a thickness of approximately 1500 angstroms.

In FIG. 8g, doped LPCVD polysilicon 206 is deposited at a thickness of approximately 4500 angstroms, patterned according to word line regions 232 (shown in FIG. 8d), and etched to a depth of approximately 4500 angstroms as shown in FIG. 8g. Diffused N+ regions 214 are formed by ion migration from polysilicon 216 via lateral contact 230.

Fabrication of memory cell array 198 is completed by depositing interlevel oxides 210 as shown in FIG. 6, by patterning and etching metal bit line contacts 234 (shown in FIG. 8d), and by depositing, patterning and etching metal bit lines 202 as shown in FIGS. 6 and 8d. In both the CPT and PSP transistor memory cells, cell pitch is 2 micrometers × 2.5 micrometers. Layouts are drawn with 0.8 micrometers design rules. Both the CPT and PSP memory cells have large cell capacitances and small bit line resistances. Moreover, neither the CPT nor PSP memory cells requires epitaxial material, thereby diminishing the cost of wafer substrate.

Calculated cell capacitance, word line and bit line stray capacitance and resistance are summarized in TABLE I.

TABLE I

| Cell | Cell Cap | B/L cap | W/L cap | B/L res | W/L res |
| --- | --- | --- | --- | --- | --- |
| CTT | 49 fF | 0.945 fF | 2.61 fF | 62.4 ohm | 4.69 ohm |
| CPT | 82 fF | 0.72 fF | 1.80 fF | 0.18 ohm | 3.75 ohm |

TABLE I-continued

| Cell | Cell Cap | B/L cap | W/L cap | B/L res | W/L res |
| --- | --- | --- | --- | --- | --- |
| PSP | 105 fF | 0.72 fF | 2.42 fF | 0.18 ohm | 3.7 ohm |

Although the present invention and its advantages have been described in detail, it should be understood that various changes, substitutions and alterations can be made herein without departing from the spirit and scope of the invention as defined by the appended claims.

What is claimed is:

1. A method of forming a memory cell comprising the steps of:
   forming a pillar of a first conductivity type in a semiconductor workpiece;
   forming a sidewall insulator on the sidewalls and surrounding said pillar;
   forming a first capacitor electrode adjacent and surrounding said sidewall insulator and extending to the top of said pillar, said first capacitor electrode suitable for being biased with a selected voltage relative to said semiconductor pillar;
   forming a mask over a first portion of said first capacitor electrode;
   etching a portion of said first capacitor electrode region which is not beneath said mask to a selected depth;
   refilling said etched portion with a first insulating region, said first insulating region having a thickness equal to about said selected depth;
   forming a first transistor source/drain region of said second conductivity type in the top portion of said semiconductor pillar;
   etching said first portion of said first capacitor electrode region to about said selected depth;
   forming a second insulating region adjacent said first insulating region and abutting said pillar, said second insulating region having a thickness substantially less than said selected depth;
   forming a gate electrode over said second insulating region and adjacent said sidewall insulator; and
   forming an inversion layer in said pillar adjacent said sidewall insulator by biasing said first capacitor electrode with said selected voltage, said inversion layer serving both as a second source/drain region of said transistor and a second capacitor electrode.

2. The method of claim 1 and further comprising the step of coupling said gate electrode to a word line.

3. The method of claim 2 wherein said coupling step comprises the step of coupling said gate electrode to said word line partially overlying a top end of said pillar.

4. The method of claim 2 wherein said coupling step comprises the step of coupling said gate electrode to said word line having a thick region and a thin region, said thick region being nearer said gate electrode.

5. The method of claim 2 wherein said coupling step comprises the step of coupling said gate electrode to said word line comprising a polycrystalline silicon material.

6. The method of claim 1 wherein said first transistor source/drain region comprises an implanted region.

7. The method of claim 1 wherein said second insulating region is formed using a differential oxidation process.

8. The method of claim 1 wherein said pillar forming step comprises the step of forming said pillar having a trapezoidal prism shape.

9. The method of claim 1 wherein said pillar forming step comprises the step of forming said pillar having a P type conductivity.

10. The method of claim 1 wherein said pillar forming step comprises the step of forming said pillar having a top end smaller than a bottom end of said pillar.

11. The method of claim 1 wherein said first transistor source/drain region forming step comprises the step of forming said first source/drain region as a diffused region.

12. The method of claim 11 wherein said first source/drain forming step comprises the step of forming said diffused region having an N type conductivity.

13. The method of claim 1 and further comprising the step of coupling said first source/drain region to a supply line.

14. The method of claim 13 wherein said coupling step comprises the step of coupling said supply line to a top end of said pillar.

15. The method of claim 13 wherein said coupling step comprises the step of coupling said first source/drain region to said supply line comprising a metal material.

16. The method of claim 1 wherein said transistor forming step comprises the step of forming said control line as having a thick region and a thin region, said thin region over said first insulating region and said thick region over said second insulating region.

17. The method of claim 1 wherein said gate electrode comprises a polycrystalline silicon material.

18. The method of claim 1 wherein said pillar forming step comprises the step of forming said pillar comprising an inversion layer having an N type conductivity.

19. The method of claim 1 wherein said sidewall insulator forming step comprises the step of forming said sidewall insulator comprising an oxide material.

20. The method of claim 1 wherein said first capacitor electrode forming step comprises the step of forming said first capacitor electrode comprising a polycrystalline silicon material.

* * * * *